United States Patent [19]
Miyano et al.

[11] 3,953,212
[45] Apr. 27, 1976

[54] PRE-SENSITIZED LITHOPRINTING PLATE REQUIRING NO FOUNTAIN SOLUTION

[75] Inventors: Shizuo Miyano; Asaji Kondo; Shinzo Kishimoto; Kenichiro Yazawa, all of Asaka, Japan

[73] Assignee: Fuji Photo Film Co., Ltd., Minami-ashigara, Japan

[22] Filed: Nov. 2, 1973

[21] Appl. No.: 412,517

[30] Foreign Application Priority Data
Nov. 2, 1972 Japan............................ 47-110073

[52] U.S. Cl.......................................... 96/75; 96/33; 96/35.1; 96/86 P; 96/87 R; 96/115 R; 101/456; 101/465

[51] Int. Cl.² ...................... G03C 1/52; G03C 1/68; G03C 1/72

[58] Field of Search .................. 96/33, 75, 85, 86 P, 96/115 R, 35.1; 101/450, 453, 456, 457, 460–467

[56] References Cited
UNITED STATES PATENTS

| 3,209,683 | 10/1965 | Gruebel | 96/33 X |
| 3,498,786 | 3/1970 | Notley et al. | 96/91 R |
| 3,511,178 | 5/1970 | Curtin | 96/75 X |
| 3,606,922 | 9/1971 | Doggett | 96/75 X |
| 3,632,375 | 1/1972 | Gipe | 96/75 X |
| 3,660,097 | 5/1972 | Mainthia | 96/75 |
| 3,677,178 | 7/1972 | Gipe | 96/75 X |
| 3,758,306 | 9/1973 | Roos | 96/36.2 X |
| 3,759,711 | 9/1973 | Rauner et al. | 96/75 X |
| 3,779,774 | 12/1973 | Cope et al. | 96/91 R X |
| 3,782,940 | 1/1974 | Ohto et al. | 96/35.1 |

OTHER PUBLICATIONS

Kirk–Othmar, "Ency. of Chem. Tech.," 2nd Ed., Vol. 18, 1969, pp. 221–257.

Primary Examiner—Charles L. Bowers, Jr.
Attorney, Agent, or Firm—Sughrue, Rothwell, Mion, Zinn & Macpeak

[57] ABSTRACT

A presensitized lithoprinting plate which needs no fountain solution on printing comprising a support and a coating layer of a mixture of a photosensitive material and a silicone rubber.

10 Claims, 2 Drawing Figures

PRE-SENSITIZED LITHOPRINTING PLATE REQUIRING NO FOUNTAIN SOLUTION

BACKGROUND OF THE INVENTION

1. Field of the Invention

This invention relates to a presensitized lithoprinting plate which needs no fountain solution. More particularly, the invention is concerned with a presensitized lithoprinting plate (for brevity it will hereinafter be referred to as PS plate) which needs no fountain solution, characterized by a photosensitive coating layer comprising a mixture of a photosensitive material and a silicone rubber.

2. Description of the Prior Art

A lithoprinting plate which needs no fountain solution has as its objects a simplification of the traditional off-set printing technique. In conventional lithography in which off-set processes are predominant, a printing plate is prepared by exposing a PS plate through a negative or positive image and treating the so exposed PS plate with an appropriate treating solution to form imagewise oleophilic areas and hydrophilic areas. On printing, a fountain solution is applied to the hydrophilic areas, i.e. the non-image areas, and, thereafter, an ink is applied to the oleophilic areas, i.e. the image areas. In this process, the application of the fountain solution is very troublesome and this is a significant drawback of the process. One method of eliminating this drawback is a lithoprinting process which does not require a fountain solution. In this process, practical printing is attained by using a printing plate having a layer of a highly ink-repellent silicone rubber and supplying an oily ink without application of any fountain solution. Some techniques for the manufacture of PS plates in this manner have been disclosed in Japanese Pat. Specification published for public inspection Nos. 23042/1969, 2361/1972 and 16044/1971 and U.S. Pat. Nos. 3,511,178 and 3,632,375.

In the processes disclosed in the Japanese Patent Specification published for public inspection No. 16044/1971 and U.S. Pat. No. 3,511,178, a PS plate having a layer of a silicone rubber on a layer of a photosensitive material applied to a support is used. The PS plate is exposed through a negative image and treated with a processing solution to remove the photosensitive layer and the silicone rubber layer in the exposed areas, i.e. the image areas. On the other hand, in the unexposed areas, i.e. the non-image areas, the silicone rubber remains unchanged. When an ink is applied to the printing plate thus obtained, the ink adheres to the image areas only. The PS plate of this type which does not require a fountain solution has a layer of a silicone rubber over a photosensitive layer, so that there is a problem of adhesion between the two layers. An intermediate layer containing a diazo compound between the two layers for enhancing the adhesion is needed and, consequently, the plate has a threelayered structure. Since a condensate of p-diazo-diphenylamine and formaldehyde employed as the intermediate layer, i.e. the adhesion-improving layer, is hydrophilic it is difficult to apply the condensate uniformly to a photosensitive layer comprising of oleophilic binder. In addition, merely interposing te condensate as an intermediate layer between the silicone rubber layer and photosensitive layer does not enhance the adhesion and it is necessary to heat, after application thereover of a silicone rubber layer, at 90°C for 5 to 10 minutes in an oven to cure the silicone rubber and then at 120°C for 10 minutes to thermally decompose the p-diazodiphenylamine-formaldehyde condensate to obtain the desired effect. The manufacture of the printing plate using this process is greatly restricted on account of these shortcomings.

In the processes disclosed in Japanese Pat. Specification published for public inspection Nos. 23042/1969 and 2361/1972, a film of a water-soluble polymer is formed on a strippable temporary support and a diazo photosensitive material is applied thereto. To a support separately provided, a silicone rubber is applied and the photosensitive layer is then forced to the surface of the uncured silicone rubber. After curing of the silicone rubber the temporary support is stripped off. The PS plate thus obtained is exposed through a negative image and processed to remove the photosensitive layer in the unexposed areas, i.e. the non-image areas. Thus, the surface of the silicone rubber of the under layer is exposed while the irradiated image areas remain unchanged. When an ink is applied to the plate thus obtained, the ink adheres to the image areas only. In this process, it is necessary to employ a temporary support to solve a difficult problem when a hydrophilic diazo photosensitive material is applied to a water-and oil-repellent silicone rubber. Thus, the manufacture of the printing plate in this process is even more restricted by these two-fold drawbacks, i.e., use of a temporary support in addition to the multi-layered structure of the plate.

In the process disclosed in U.S. Pat. No. 3,632,375, a silicone rubber is applied to a support and, while the silicone rubber is still in an uncured state, a high molecular weight adhesion improving material is spread thereover. An aqueous solution of a diazo photosensitive compound containing an emulsion of a film-forming material is spread thereover and the silicone rubber is cured. This process also involves the troublesome technique of applying a finely divided water-soluble polymer as an adhesion improver to attain firm bonding between the silicone rubber and the photosensitive material. It is evident that the manufacture of the plate in this process will be much more restricted by this troublesome step.

The problems in the prior art can be summarized as follows:

1. The plate is of a multi-layered structure wherein a photosensitive material and a silicone rubber form two distinctly separate layers.
2. It is important in the manufacture of the plate to attain strong bonding between the two layers.
3. In case of PS plates in which the uppermost layer is a silicone rubber layer, the silicone rubber layer is limited in its thickness to permit penetration of a developing solution.
4. Where a photosensitive layer is formed on a silicone rubber layer, it is necessary to use an extra, such as a temporary, support and, in addition, a sufficient improvement in adhesion between the silicone rubber layer and photosensitive layer can not be expected.

SUMMARY OF THE INVENTION

It is an object of the present invention to provide a presensitized plate requiring no fountain solution which is free from the aforesaid drawbacks, namely, has a simplified structure and can be prepared in a simple manner. In greater detail, the present invention provides a presensitized plate requiring no fountain solution for use in positive work and in negative work which is prepared by applying a single layer of a mixture of a photosensitive material and a silicone rubber on a support.

BRIEF DESCRIPTION OF THE ACCOMPANYING DRAWINGS

DETAILED DESCRIPTION OF THE INVENTION

Figure 1:
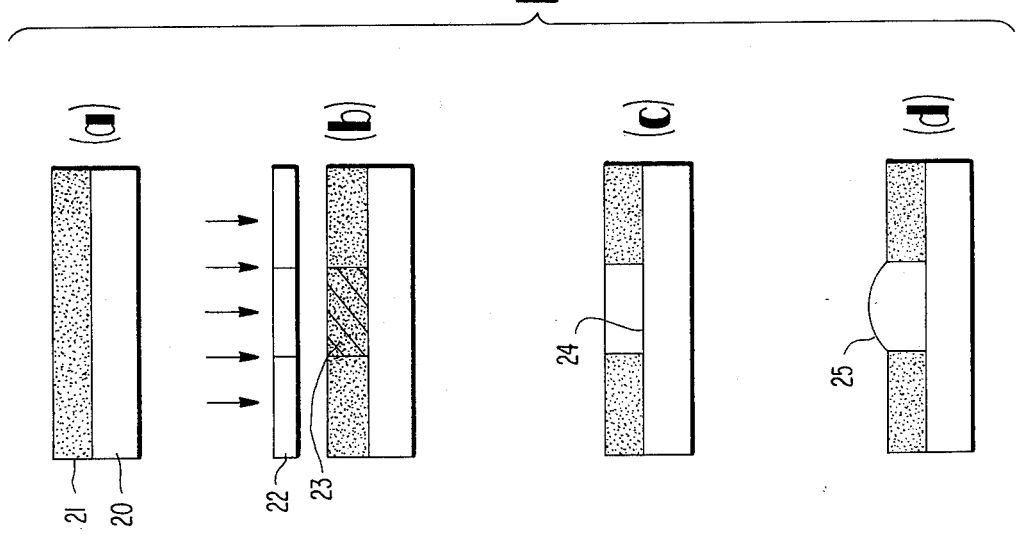
FIG. 1 shows the cross-sectional views of a PS plate in principal stages in the course of the manufacture of a printing plate using a positive-type PS plate of the present invention.

It appears from the premises of the prior processes that it is impossible to prepare a PS plate requiring no fountain solution unless a photosensitive material and a silicone rubber are always formed into separate layers because a silicone rubber should be as pure as possible for exerting an ink-repellancy.

We, however, have discovered that a silicone rubber containing a photosensitive material within a certain limit is not inferior in its properties as an ink-repelling material in PS plates as compared to a pure silicone rubber, and since it is advantageous to manufacture a single-layered structure we arrived at the present invention.

While the details of the structure of the coating layer of a mixture of a silicone rubber and a photosensitive material in accordance with the present invention is uncertain, a number of structural possibilities exist: a structure in which the silicone rubber is dispersed in a matrix of the photosensitive material, a structure in which the photosensitive material is dispersed in a matrix of th silicone rubber, a complex of the aforesaid two structures, and a structure in which fine particles of the silicone rubber and of the photosensitive material are mingled in an irregular mosaic.

In any case, a mixed coating liquid of a photosensitive material and a silicone rubber used for forming a mixed coating layer may be an inherently heterogeneous dispersion or a homogeneous solution in which phase separation occurs between the two components in the course of mixing, coating and drying to form a dried coating film of a heterogeneous mixture of a photosensitive material and a silicone rubber.

The PS plate requiring no fountain solution of the present invention is in general prepared by mixing a organic solvent solution of a photosensitive material and an organic solvent solution of a silicone rubber to form a coating liquid and applying the coating liquid once on a support to form a singlelayered coating film. The organic solvent of the photosensitive material and the silicone rubber can be the same, and suitable examples include ketones such as methyl ethyl ketone, methyl isobutyl ketone, cyclohexanone, etc. These solvents can be used alone or as mixtures thereof in any ratio. The concentration of the photosensitive material in the organic solution is suitably from about 0.1 to about 10 wt % and preferably from about 0.4 to about 5 wt %, and that of the silicone rubber in the organic solution is suitably from about 0.1 to about 10 wt % and preferably from about 1 to about 3 wt %. The coating film is heated to about 100° to about 150°C, preferably to about 110° to about 125°C, to effect a curing of the silicone rubber whereby a finished PS plate requiring no fountain solution is obtained having a mixed coating layer of a photosensitive material and a silicone rubber. The time for heating to effect the curing the silicone rubber with the photosensitive material can suitably range from about 5 to about 30 minutes, preferably from about 5 to about 15 minutes, and most preferably about 5 minutes at 120°C. Either a plate for negative work or a plate for positive work is obtained by merely changing the photosensitive material used.

Examples of photosensitive materials for negative work, for example, a diazo compound, are described in U.S. Pat. Nos. 2,649,373; 2,714,066 3,751,257; and the p-quinone diazides are described in U.S. Pat. Nos. 2,754,209; 2,975,053; 2,994,608; 2,995,442; and 3,029,146.

Example of photosensitive materials for positive work, for example, o-quinone diazides, are described in U.S. Pat. Nos. 2,772,972; 2,767,092; 2,766,118; 2,859,112; 2,907,655; 3,046,110; 3,046,111; 3,046,112; 3,046,113; 3,046,114; 3,046,115; 3,046,116; 3,046,118; 3,046,119; 3,046,121; 3,046,122; 3,046,123; 3,046,124; 3,061,430; and 3,106,465.

The most preferred of the o-quinone diazides is an ester of 2-diazo-1-naphthol-4-sulphonic acid and an ester of 2-diazo-2-naphthol-5-sulphonic acid, in which the ester group is the residue of a polymeric phenol obtained by the interaction of a polyhydric phenol and a ketone. The polymeric phenol is preferably a product obtained by the reaction of acetone with pyrogallol at room temperature in the presence of a catalyst such as phosphorous oxychloride. The reaction ratio of the acid chloride to the polymeric phenol can range from about 1:0.6 to about 1:2, with preferred ratios being about 1:1 to about 1:1.8.

The PS plate of the present invention is exposed through a positive or negative image and processed with an appropriate developing solution as described in the above referenced U.S. Patents disclosing negative working plates or positive working plates to obtain a printing plate. In case of a negative work, the exposed areas, i.e., the image areas, are dissolved away leaving ink-receptive surfaces. In case of positive work, the exposed non-image areas are cured and the undeveloped unexposed areas, i.e., the image areas, are dissolved away leaving ink-receptive surfaces. In both cases, the silicone rubber is removed in the image areas leaving recesses and ink-repellency in these areas is lost. When an ink is applied to the plate thus obtained, it adheres to the image areas and does not adhere to the non-image areas at all due to presence of the ink-repellent silicone rubber. Thus, printing matter of a good quality are obtainable without using a fountain solution.

Referring to the materials used in the practice of the present invention in greater detail, as the photosensitive material any of the known photosensitive materials for negative and positive works used in conventional PS plates can be used. The photosensitive material which can be used in the manufacture of PS plates requiring no fountain solution in accordance with the present invention includes, e.g., o-quinonediazides and hetero- or iso-polyacids of p-diazodiphenylamines as used in conventional plates for positive work as disclosed in U.S. Pat. Nos. 2,772,972; 2,767,092; 2,766,118; 2,859,112; 2,907,655; 3,046,110; 3,046,111; 3,046,112; 3,046,113; 3,046,114; 3,046,115;

3,046,116; 3,046,118; 3,046,119; 3,046,121; 3,046,122; 3,046,123; 3,046,124; 3,061,430; and 3,106,465. While these compounds are used in positive work in case of the conventional PS plates, PS plates for negative work are obtained when they are used in the manufacture of PS plates requiring no fountain solution in accordance with the present invention. On the other hand, the photosensitive material which can be used in the manufacture of PS plates for positive work in accordance with the present invention includes, e.g., those materials for use in the manufacture of the conventional negative-work PS plates, as disclosed in U.S. Pat. Nos. 2,649,373; 2,714,066 3,751,257; 2,754,209; 2,975,053; 2,994,608; 2,995,442; and 3,029,146 such as the condensates of p-diazodiphenylamine with formaldehyde, p-quinonediazides, azide compounds, polyvinyl cinnamates, polyvinyl cinnamilidenes, poly(cinnamoyloxyethyl acrylate), poly(cinnamoyloxyethyl methacrylate), copolymers of such acrylates and methacrylates, and photosensitive unsaturated polyesters formed by condensation of p-phenylene diacrylic acid with a polyhydric alcohol having a cyclohexyl group in molecule. The unsaturated polyesters which can be suitably used are polycondensates of molecular weights of approximately 1,000 to several ten thousands of a p-phenylene diacrylic acid or the esters thereof with a polyhydric alcohol containing a cyclohexyl group in the molecule, such as 1,4-dihydroxycyclohexane, 1-oxy-4-methylolcyclohexane and 1,4-dimethylolcyclohexane.

As the silicone rubber there may be used in a single package cold-setting silicone rubber (the so-called one-shot silicone resin), a two package cold-setting silicone rubber (the so-called two-shot silicone resin) and mixtures thereof.

The single package-type silicone rubber includes those having dimethylpolysiloxane chains terminated by acetyl, oxime, alkyl or amino groups. The single package-type silicon rubber is a linear compound which has repeating units of the following general structure

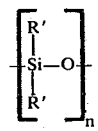

n = 2–2000

R', which can be the same or different, is a monovalent alkyl or aryl group, or a cyanoaryl group. Generally less than 2 – 3 molar % of the R' groups are vinylphenyl or halovinyl or phenyl, but most usually essentially, R' is a methyl group.

These silicone rubbers contain the following terminal groups

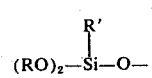

where R is an alkyl group having 1 to 3 carbon atoms, and R' is as described above;

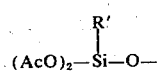

where Ac is an acetyl group and R' is as described above;

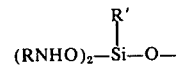

where R is an alkyl group having 1 to 3 carbon atoms and R' is as described above; and

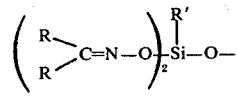

where R is an alkyl group having 1 to 3 carbon atoms and R' is as described above.

The single package type silicone rubber becomes a silicone elastomer of high molecular weight upon curing by hydrolysis (at the above described terminal groups). Upon hydrolysis, the compounds eliminated are acetic acid an alcohol, an oxine, etc. depending on the substituent terminal group. Depending upon the released components, the commercially available silicone rubbers are classified into four types: de-acetic acid-type, de-oxime-type, de-alcohol-type and deamination-type. A de-alcohol type is preferred. The de-acetic acid-type is commercially available as KE-41RTV (RTV is an abbreviation of Room Temperature Vulcanization) and KE-42RTV supplied by Shin-etsu Chemical Industries Co., Ltd., SH-781RTV, SH-9731RTV, SH-9732RTV, SH-9737RTV and SH-9140RTV supplied by Toray-Silicone Co., with these types having the general formula

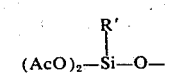

where R is alkyl ($C_1 - C_3$), and Ac is acetyl, the de-oxime-type is commercially available as KE-44RTV and KE-45RTV supplied by Shin-etsu Chemical Industries Co., Ltd. and SH-780-RTV and PRX-305 dispersion supplied by Toray-Silicone Co. these silicone rubbers having the general formula

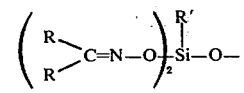

where R is alkyl ($C_1 - C_3$), the de-alcohol-type is commercially available as DC-3140RTV supplied by Dow-Corning Co. and Silaseal E supplied by Fuji Kobunshi Co., Ltd., and the deamination-type is commercially available as Elastseal 33, Elastseal 34, Elastseal 50 and Elastseal 59 supplied by Wacker Chemie Co., with these types having the general formula

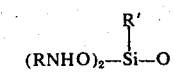

wherein R is alkyl ($C_1 - C_3$).

The two package-type silicone rubbers are basically of two types: a condensation type and an addition type.

The two package addition reaction type silicone rubber generally, arises from the following reaction schematic

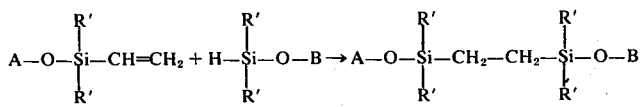

or the following reaction schematic

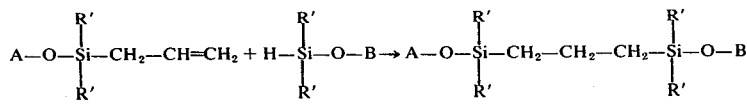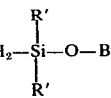

where R' is as described above.

In the above, the symbols A and B have been used to represent the organosiloxane residue bonded to these addition polymerizing type terminal groups. A and B can be the same or different and their composition can vary since the essential characteristic of these organosiloxanes is in the terminal groupings which are addition polymerizable, in which palladium or platinum compounds are used as a catalyst and due to addition polymerization between, the unsaturated groups such as a vinyl group or allyl group and the

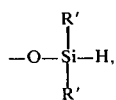

moiety the rubber cures.

Thus, the so called two-packages type silicone rubber is one in which the catalyst and the siloxane are separate and are mixed when used.

A specific example of the two package addition reaction type silicone rubber comprises a mixture, as one component, of an organopolysiloxane having a vinyl group in the molecule and an organohydrogenpolysiloxane, e.g., a mixture of compounds having terminal groups of the following general formula

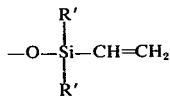

terminal group of polyorganosiloxane

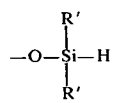

terminal group of organohydrogenpolysiloxane wherein R' is as previously described, and a catalyst, as another component, such as a platinum compound or a palladium compound. H$_2$PtCl$_6$ is often used as a catalyst. The two components are combined together immediately before use.

The addition type silicone rubbers commercially available include KE-103RTV, KE-106RTV and KE-1300RTV supplied by Shinetsu Chemical Industries Co., Ltd., and SH-9555RTV supplied by the Toray-Silicone Co., in which R' is alkyl (C$_1$ – C$_3$).

The two package-type silicone condensation type rubber generally arises from the following reaction schematic

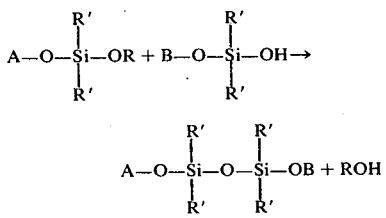

wherein R') R, A and B are as hereinbefore defined, in which the terminal groups which condense can be represented by the following formulas

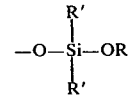

and

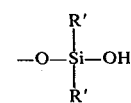

A suitable catalyst component is SnCl$_3$.

The commerically available condensation-type silicone rubbers include KE-10RTV, KE-12RTV, KE-15RTV, KE-17RTV, KE-102RTV supplied by Shinetsu Chemical Industries Co. Ltd., and SH-9551RTV, SH-9552RTV, SH-9553RTV and SH-9554RTV supplied by Toray-Silicone Co., in which R' is alkyl C$_1$ – C$_3$.

When the adhesion between the coating layer of the mixture of a photosensitive material and a silicone rubber in accordance with the present invention and a support is poor, a conventional subbing agent can be used to enhance the adhesion. As a subbing agent, a silicone primer is used. As the silicone primer, solutions in nonpolar solvents of monomers or substances having a low molecular weight such as carbon functional organic silanes, for example, alkylsilanol, esters thereof, organoalkoxysilane and alkylvinylsilanes, such as Toray Silicone PR X 304, Primer SH506 Surface active agent, and Toshiba Silicone Primer-ME-11 are preferably used.

These silane compounds have organic groups of two kinds of different reactivity, for example:

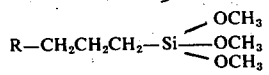

where R can be, for example, an alkyl group, an alkylamino group, an aminoalkyl group, an amino group, an alkoxyaryl group, a methacryloxy group, a glycidioxy group, a cycloalkyl group, and the like.

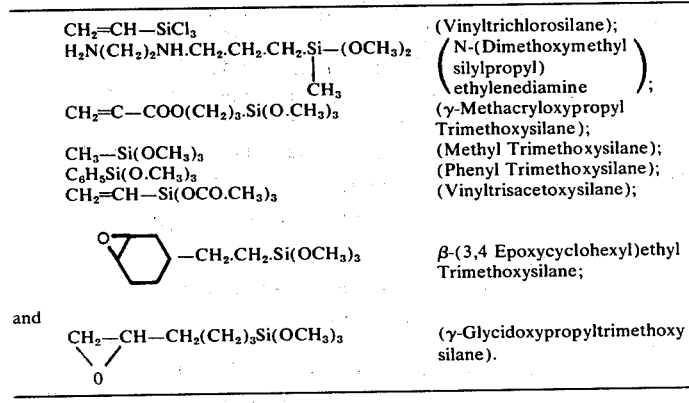

The support used in the present invention includes aluminum plates, zinc plates, iron plates and like metallic plates used in conventional PS plates as disclosed in U.S. Pat. Nos. 2,119,031; and 3,751,257. These supports can may be used as they are or after, e.g., graining. The aluminum plate can be subjected to a chemical treatment or anodic oxidation. In addition to these metallic plates, films of polyester or acetylcellulose having a good dimensional stability can be used as the support. A readily available support which can be used is the so called laminate paper, consisting of a paper laminated with a plastic or aluminum foil. If desired, the support can be subbed with a primer or polymer.

The developing solution used for the PS plate requiring no fountain solution of the present invention is a processing solution used for the purpose of physically distinguishing between the exposed areas and the unexposed areas of the mixed coating layer of a silicone rubber and a photosensitive material in accordance with the present invention and removing the silicone rubber in the image area. The properties required for the developing solution to be used in the process of the present invention are: that the developing solution (1) not destroy the silicone rubber layer, but (2) penetrate into the silicone rubber and (3) selectively distinguish the areas in which the photosensitive material has been changed as a result of exposure from the areas wherein the photosensitive material remains unchanged. Accordingly, the composition of the developing solution can be appropriately chosen in accordance with the photosensitive material used.

The photosensitive material and the silicone rubber are mixed in a weight ratio of the photosensitive material to the silicone rubber of from 0.1 to 1.1, preferably from 0.2 to 1.1 and more desirably from 0.3 to 0.9. The coating mixture can be applied in a thickness of about 1 to 10 microns, and a printing plate of a good practical quality is obtained when the thickness is 2 to 5 microns.

Illustration of the structure of and the plate making process using the PS plate of the present invention will now be made by referring to the accompanying drawings.

In FIG. 1, (a) shows a cross-sectional view of a positivetype PS plate in accordance with the present invention, (b) shows the cross-sectional view upon exposure, (c) shows the crosssectional view of the plate after development and (d) shows the cross-sectional view of a printing plate to which an ink has been applied. In FIG. 1, numeral 10 indicates a support, 11 is a coating layer of a mixture of a photosensitive material and a silicone rubber, 12 is a positive image film, 13 is the insolubilized areas after exposure, 14 is the ink-receptive surfaces formed by removal of photosensitive layer by a developing solution and 15 indicates an ink.

Figure 2:
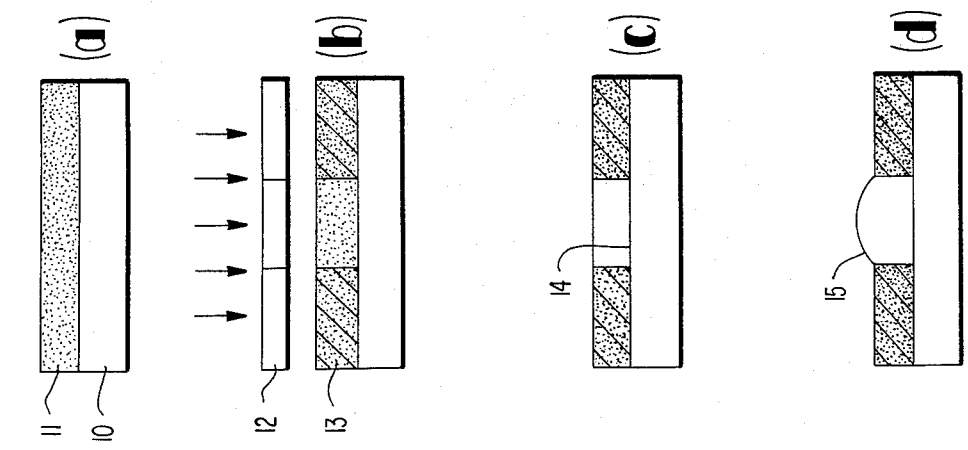
FIG. 2 shows the cross-sectional views of a PS plate in principal stages in the course of the manufacture of a printing plate using a negative-type PS plate of the present invention.

FIG. 2 shows a PS plate requiring no fountain solution of the present invention, in which (a) is a cross-sectional view of a negative-type PS plate of the present invention, (b) is the cross-sectional view upon exposure, (c) is the crosssectional view of the plate after development and (d) is the cross-sectional view of a printing plate to which an ink has been applied. In the figure, numeral 20 indicates a support, 21 indicates a coating layer of a mixture of a photosensitive material and a silicone rubber, 22 indicates a negative image film, 23 indicates the areas solubilized by exposure, 24 indicates the ink-receptive surfaces exposed by development and 25 indicates an ink.

Advantages brought about by the present invention will be summarized as follows:

1. Since the PS plate of the present invention is of a singlelayered structure, there is no problem of adhesion between a silicone layer and a photosensitive layer as in prior PS plates of a multi-layer structure.

2. Either a negative-type or a positive-type can easily be prepared merely by altering the photosensitive material used.

3. With prior art PS plates, in which a silicone rubber is applied over a photosensitive layer, the thickness of the silicone rubber layer is limited, while in case of the PS plates of the present invention the thickness is not so limited.

4. The photosensitive material serves as a filler to enhance the strength of the silicone rubber layer.

5. A printing plate made from the PS plate of the present invention gives a sharp print because of a very high resolving power of the PS plate owing to its monolayered structure.

6. A PS plate of an extremely good quality can be made at a moderate cost by virtue of the aforesaid characteristics (1) to 5.

The present invention will be illustrated in greater detail by reference to the following examples. Unless otherwise indicated, all parts and percents are by weight.

EXAMPLE 1

In 30 ml of methyl ethyl ketone there were dissolved 1.2 g of the diazo-oxide polymeric phenol ester resin described in Example 1 of British Pat. No. 1,113,759 as a photosensitive compound and 1.5 g of a silicone rubber, DC-3140RTV, a single package de-alcohol-type silicone rubber produced by Dow-Corning Co. The silicone rubber containing the photosensitive solution was cast uniformly on a degreased aluminum plate in sufficient amount to form a layer of a dry thickness of 5 microns. After evaporation of the solvent, the coated aluminum plate was heated for 10 minutes in an oven at 120°C for curing the silicone rubber to obtain a nega-type PS plate requiring no fountain solution of the present invention. A negative film was superposed on the PS plate and the assembly was irradiated for 2 minutes using a PS printer A-3 manufactured by the Fuji Photo Film Co. Ltd. The exposed plate was treated with a developing solution consisting of a 3:1 (by volume) mixture of isopropanol and water to dissolve away the photosensitive compound together with the silicone rubber in the irradiated areas, i.e., the image areas, thereby exposing the surface of the aluminum plate. The procedure was carried out under a safety light.

The printing plate thus obtained was mounted in a Davidson's Duris 500 printing machine from which the mechanism for applying the fountain solution had been removed and printing was carried out using "Speed King Black" ink supplied by Toyo Ink Co. to obtain 1000 prints of a good quality.

After the printing, the plate had been injured only slightly.

EXAMPLE 2

In 133 ml of a 3:1 (by volume) mixture of methyl ethyl ketone and cyclohexane, there were dissolved 1 g of a photosensitive unsaturated polyester prepared by a 1:1 (molar ratio) polycondensation of p-phenylenediacrylic acid with 1,4-dihydroxyethylcyclohexane (mol weight about 5,000) as a photosensitive compound, 0.4 g of 1-methyl-2-benzoylmethylene-betanaphthothiazoline as a sensitizer and 3 g of a silicone rubber, DC-3140RTV. The coating solution, was uniformly cast onto a degreased aluminum plate in a dry thickness of about 5 microns. After evaporation of the solvent, the coated plate was dried for 5 minutes in an oven at 120°C to obtain a PS plate requiring no fountain solution.

The PS plate was exposed through a positive iamge film for 60 seconds using a PS printer A-3, manufactured by the Fuji Photo Film Co., Ltd. and developed with a 5:3:2 (by volume) mixture of cellosolve acetate, propylene glycol and water to expose the surface of the aluminum plate in the unirradiated areas, i.e. the image areas. When an ink was applied to the plate, it adhered to the exposed aluminum surfaces but did not adhere to the non-image areas at all. In a similar manner to that described in Example 1, 500 prints of a good quality were obtained. After the printing, the plate remained substantially uninjured.

EXAMPLE 3

The procedure of Example 2 was repeated using 0.3 g of 2,6-di-(4'-azidobenzal)-cyclohexanone in place of 1-methyl-2-benzoylmethylene-beta-naphthothiazoline to obtain a PS plate requiring no fountain solution of the present invention for posi-work.

EXAMPLE 4

A photosensitive solution was prepared by dissolving 0.3 g of poly(cinnamoyloxyethyl methacrylate) of a molecular weight of 30,000, 0.1 g of 2,6-di(4'-azidobenzol)cyclohexanone and 0.7 g of DC-3140RTV in 133 ml of a 3:1 (by volume) mixture of methyl ethyl ketone and cyclohexanone. The solution was uniformly cast onto an aluminum plate and heated for 5 minutes in an oven at 120°C to obtain a PS plate requiring no fountain solution of the present invention for positive work. The PS plate was processed with a developing solution as described in Example 1 to obtain a printing plate of a good quality.

EXAMPLE 5

The same procedure as described in Example 4 was repeated except that there were used 0.2 g of 2,6-di(4'-azidobenzal)-cyclohexanone as a photosensitive compound and 1 g of DC-3140RTV in 133 ml of a 3:1 (by volume) mixture of methyl ethyl ketone and cyclohexanone to form a photosensitive solution. In a similar way, there was obtained a PS plate requiring no fountain solution and of a good quality. The plate could be easily developed by n-heptane.

While the invention has been described in detail and with reference to specific embodiments thereof, it will be apparent to one skilled in the art that various changes and modifications can be made therein without departing from the spirit and scope thereof.

What is claimed is:

1. A pre-sensitized lithoprinting plate comprising a support having an oleophilic surface and having thereon a single coating layer consisting of a heterogeneous mixture of (1) a photosensitive material selected from an o-quinonediazide, an azide compound, a condensate of p-diazodiphenylamine with formaldehyde, a p-quinonediazide, polyvinyl cinnamate, polyvinyl cinnamilidene, poly(cinnamoyloxyethyl acrylate), poly(cinnamoyloxyethyl methacrylate), copolymers of said acrylates and methacrylates, or an unsaturated polyester comprising the condensation product of p-phenylene diacrylic acid with a polyhydric alcohol containing a cyclohexyl group, and (2) a silicone rubber selected from (a) a single package cold-setting silicone rubber comprising dimethylpolysiloxane chains terminated by acetyl, oxime, alkyl or amino groups which have been heatcured into a de-alcohol-type silicone rubber, a de-acetic acid-type silicone rubber, a de-oxime-type silicone rubber or a deamino-type silicone rubber, or (b) a heat-cured two package cold-setting silicone rubber consisting of an addition-type silicone rubber or a condensation-type silicone rubber, said two package cold-setting addition-type silicone rubber being formed by the reaction sequence:

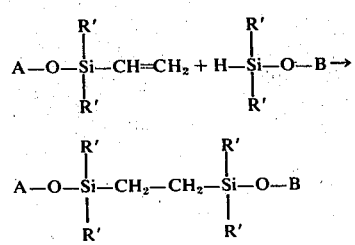

or from the reaction sequence:

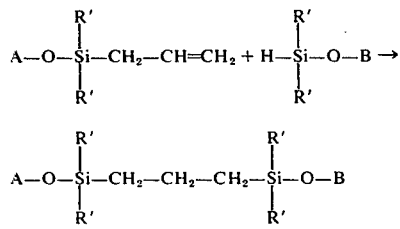

wherein R' is a monovalent alkyl group, a monovalent aryl group, a cyanoaryl group, and is the same or different group and A and B are organosiloxane residue groups; and wherein aid two package cold-setting condensation-type silicone rubber is formed by the reaction sequence:

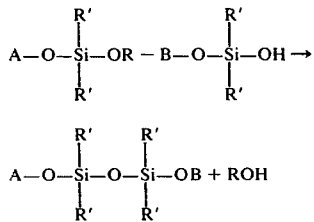

wherein R' is a monovalent alkyl group, a monovalent aryl group, a cyanoaryl group, and is the same or different group, R is an alkyl group having 1 to 3 carbon atoms, and A and B are organosiloxane residue groups; the weight ratio of said photosensitive material to said silicone rubber is from 0.1 to 1.1, and wherein said coating has a thickness of about 1 to 10 microns.

2. A pre-sensitized lithographic plate of claim 1, wherein said heat-cured single package cold-setting de-acetic acid-type silicone rubber has the general formula

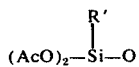

wherein R is alkyl having 1 to 3 carbon atoms and Ac is acetal; said heat-cured, single package cold-setting de-oxime-type silicone rubber has the general formula

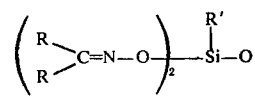

wherein R is alkyl having 1 to 3 carbon atoms; said heat-cured, single package cold-setting de-alcohol-type silicone rubber has the general formula

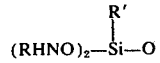

wherein R is alkyl having 1 to 3 carbon atoms; and said heat-cured, single package cold-setting deamino-type silicone rubber has the general formula

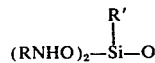

wherein R is alkyl having 1 to 3 carbon atoms.

3. The pre-sensitized lithoprinting plate of claim 1 wherein said silicone rubber is a heat-cured two package cold-setting silicone rubber.

4. The pre-sensitized lithoprinting plate of claim 1, wherein said silicone rubber is a de-alcohol-type silicone rubber.

5. The pre-sensitized lithoprinting plate of claim 1, wherein said o-quinone diazide is an ester of 2-diazo-1-naphthol-4-sulfphonic acid or an ester of 2-diazo-1-naphthol-5-sulphonic acid, in which the ester grouping is the residue of a polymeric phenol comprising the reaction product of a polyhydric phenol and a ketone.

6. The pre-sensitized lithoprinting plate of claim 5, wherein said polymeric phenol is the reaction product of acetone and pyrogallol.

7. The pre-sensitized lithoprinting plate of claim 1, wherein said support is an aluminum plate, a zinc plate, an iron plate, a polymer film, or a laminated paper.

8. The pre-sensitized lithoprinting plate of claim 1, wherein said coating has a thickness ranging from about 1 to 10 microns.

9. The pre-sensitized lithoprinting plate of claim 1, wherein between said support and said coating is a subbing adhesive layer of silicone primer.

10. The pre-sensitized lithographic printing plate of claim 1, wherein said coating contains an optical sensitizer.

* * * * *